US011193966B1

(12) United States Patent
Tsironis

(10) Patent No.: US 11,193,966 B1
(45) Date of Patent: Dec. 7, 2021

(54) LOW FREQUENCY ACTIVE LOAD PULL TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/839,579

(22) Filed: Apr. 3, 2020

(51) Int. Cl.
*G01R 27/32* (2006.01)
*G01R 27/06* (2006.01)
*H01P 5/04* (2006.01)

(52) U.S. Cl.
CPC .......... *G01R 27/32* (2013.01); *G01R 27/06* (2013.01); *H01P 5/04* (2013.01)

(58) Field of Classification Search
CPC .... G01R 27/32; G01R 31/2822; G01R 27/28; G01R 31/2614; G01R 31/2607; G01R 35/005; G01R 1/06772; G01R 1/30; G01R 1/20; G01R 31/2601; G01R 31/2612; G01R 1/0416; G01R 1/06766; G01R 1/073; G01R 1/26; G01R 27/30; G01R 29/10; G01R 31/2608; G01R 31/2621; G01R 31/2831; G01R 1/07392; G01R 1/18; G01R 1/24; G01R 27/06; G01R 31/2616; G01R 31/2841; G01R 31/2893; G01R 31/316; G01R 31/31905; G01R 31/31924; G01R 33/3628; G01R 33/3635; G01R 35/00; G01R 35/02; H03H 7/38; H03H 7/40; H03H 7/185; H03H 7/20; H03H 7/12; H03H 7/383; H03H 11/30; H03H 2007/386; H03H 2210/025; H03H 2210/04; H03H 7/1708; H03J 1/06; H03J 1/00; H03J 1/08; H03J 3/20; H03J 7/305; H03J 1/0008; H03J 1/14; H03J 2200/07; H03J 3/02; H03J 3/04; H03J 3/08; H03J 5/0263; H03J 7/00; H03J 9/00; H04L 25/0278; H04L 25/0204; H04L 25/0228; H04L 25/03019; H04L 25/03031; H04L 25/03343; H04L 25/03891; H01R 24/40; H01R 11/18; H01R 13/5205; H01R 2103/00; H01R 2201/20; H01R 9/0509; G06F 17/40; G06F 19/00
See application file for complete search history.

(56) References Cited

U.S. PATENT DOCUMENTS 5,276,411 A    1/1994   Woodin, Jr. et al.
7,449,893 B1 * 11/2008  Tsironis ............... G01R 27/32
                                                          324/623
(Continued)

OTHER PUBLICATIONS

Load Pull, online, Wikipedia [Retrieved on Aug. 24, 2017], Retrieved from Internet <URL: http://en.wikipedia.org/wiki/Load_pull>.
(Continued)

*Primary Examiner* — Vinh P Nguyen

(57) ABSTRACT

A low frequency active load pull tuner allows creating and controlling the reflection factor in a different frequency range than the operation frequency. It includes an active feedback loop and a remotely controlled digital electronic tuner, wherein the electronic tuner operates at an ordinary octave wide (Fmax/Fmin=2) frequency range (i.e. as an example 1-2 GHz), which leads to a low intermediate frequency band of 6 octaves or more. All required MHz range components for the tuner, except the custom-made digital electronic tuner, are readily available.

5 Claims, 11 Drawing Sheets

(56) References Cited

U.S. PATENT DOCUMENTS

| | | | | |
|---|---|---|---|---|
| 8,497,689 B1 * | 7/2013 | Tsironis | ............... | G01R 27/32 324/642 |
| 8,971,874 B2 * | 3/2015 | Han | ............... | H04W 24/06 455/425 |
| 9,331,670 B1 * | 5/2016 | Mahmoudi | ......... | G01R 31/2822 |

OTHER PUBLICATIONS

"Computer Controlled Microwave Tuner, CCMT", Product Note 41, Focus Microwaves Inc. 1998, pp. 2-4.

"Measurement of Impedance Tuner", presentation by Yangping Zhao, Polytechnique de Montreal, Mar. 2014.

PIN diode [online], Wikipedia [retrieved on Jun. 10, 2018]. Retrieved from Internet <URL:https://en.wikipedia.org/wiki/PIN_diode>.

"Introduction to Mixers, Lecture 15", Prof. Ali M. Niknejad, University of California, Berkeley, 2015.

Circulator [online], Wikipedia [retrieved on Mar. 7, 2019]. Retrieved from Internet <URL: https://en.wikipedia.org/wiki/Circulator>.

Low-pass filter [online], Wikipedia [retrieved on Mar. 7, 2019], Retrieved from Internet <URL: https://en.wikipedia.org/wiki/Low-pass_filter>.

Amplifier [online], Wikipedia [retrieved on Mar. 7, 2019], Retrieved from Internet <URL: https://en.wikipedia.org/wiki/Amplifier>.

RF Directional Couplers and 3dB Hybrids Overview [online], MACOM Application note M560 [retrieved on Mar. 7, 2019] Retrieved from Internet <URL:http://qtwork.tudelft.nl/~schouten/linkload/dircouplersm560.pdf>.

Heterodyne [online], Wikipedia [retrieved on Mar. 3, 2019]. Retrieved from Internet <URL: https://en.wikipedia.org/wiki/Heterodyne>.

"Multi Port Measurements", presentation by D. Blackham and K. Wong, Agilent Technologies, pp. 4-8.

* cited by examiner

FIG. 6A: Prior art
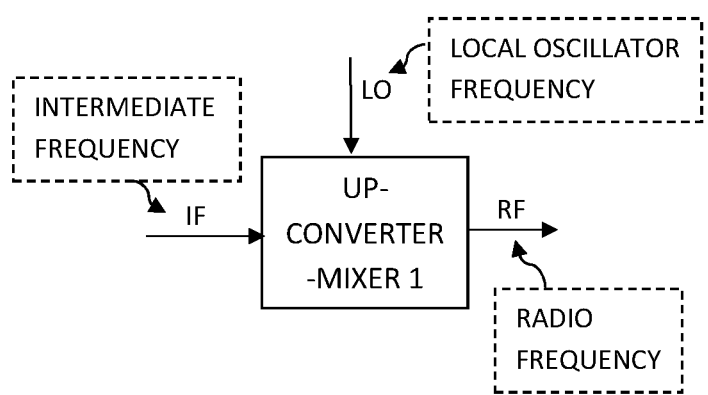
FIG. 6B: Prior art
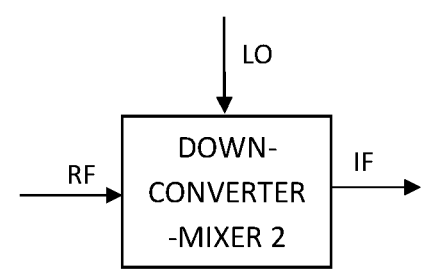

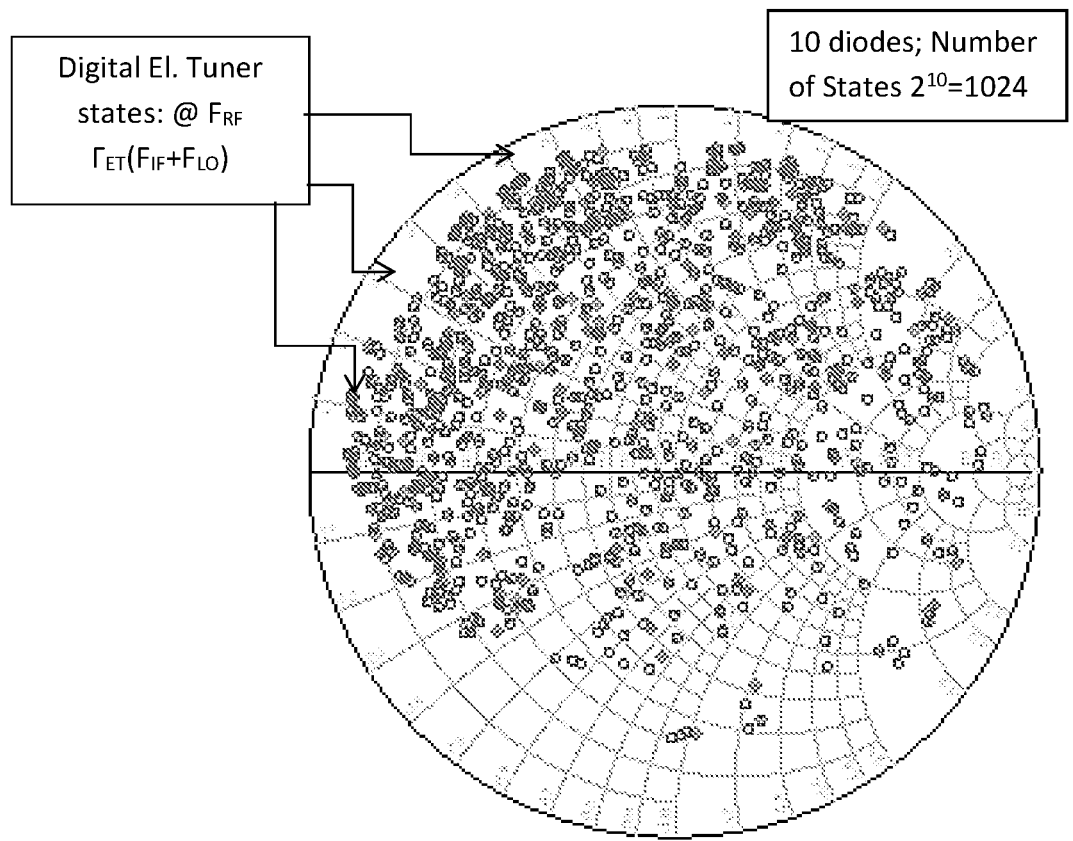
FIG. 7: Prior art

FIG. 9: Prior art

LOW FREQUENCY ACTIVE LOAD PULL TUNER

PRIORITY CLAIM

Not applicable.

CROSS-REFERENCE TO RELATED ARTICLES

1. Load Pull, online, Wikipedia [Retrieved on 2017 Aug. 24]. Retrieved from Internet <URL: http://en.wikipedia.org/wiki/Load_pull>.
2. "Computer Controlled Microwave Tuner, CCMT", Product Note 41, Focus Microwaves Inc., January 1998, pages 2-4.
3. Woodin Jr. et al., U.S. Pat. No. 5,276,411, "High power solid state programmable load".
4. "Measurement of Impedance Tuner", presentation by Yangping Zhao, Polytechnique de Montreal, March 2014.
5. PIN diode [online], Wikipedia [retrieved on 2018 Jun. 10]. Retrieved from Internet <URL:https://en.wikipedia.org/wiki/PIN_diode>.
6. "Introduction to Mixers, Lecture 15", Prof. Ali M. Niknejad, University of California, Berkeley, 2015.
7. Circulator [online], Wikipedia [retrieved on 2019 Mar. 7]. Retrieved from Internet <URL: https://en.wikipedia.org/wiki/Circulator>.
8. Low-pass filter [online], Wikipedia [retrieved on 2019 Mar. 7]. Retrieved from Internet <URL: https://en.wikipedia.org/wiki/Low-pass_filter>.
9. Amplifier [online], Wikipedia [retrieved on 2019 Mar. 7]. Retrieved from Internet <URL: https://en.wikipedia.org/wiki/Amplifier>.
10. RF Directional Couplers and 3 dB Hybrids Overview [online], MACOM Application note M560 [retrieved on 2019 Mar. 7]. Retrieved from Internet <URL: http://qtwork.tudelft.nl/~schouten/linkload/dircouplersm560.pdf>.
11. Heterodyne [online], Wikipedia [retrieved on 2019 Mar. 3]. Retrieved from Internet <URL: https://en.wikipedia.org/wiki/Heterodyne>.
12. "Multi Port Measurements", presentation by D. Blackham and K. Wong, Agilent Technologies, pp. 4-8.

BACKGROUND OF THE INVENTION AND PRIOR ART

This invention relates to Non-50Ω load pull testing (see ref. 1) of RF (radio frequency) transistor and other active components (DUT). Load pull is a method by which the load impedance presented to the DUT at a given frequency is changed systematically and the DUT performance is measured, with the objective to find optimum matching networks for the overall network design objectives, such as maximum gain, power, efficiency, linearity or else, and determine the necessary load impedances to be presented to the DUT to obtain the targeted performance.

A prior art scalar load/source pull test system is shown in FIG. 1. It comprises a signal source, source (input) and load (output) impedance tuners (see ref. 2), a device under test (DUT) housed in a coaxial or microstrip test fixture or in form of a micro-chip on a semiconductor wafer, accessed using microscopic wafer probes, and input and output measurement instruments. The instruments can measure power, DC bias and various spectral components, generated either by the signal source and modified by the DUT, or generated inherently by the non-linearities of the DUT itself. The tuners and the instruments are controlled by a PC controller using appropriate digital communication protocols (GPIB, USB, RS 232, LAN etc.). The data acquired by the test software comprise RF and DC response of the DUT to input stimulus for given source and load impedances. The data are saved in load pull files and serve to (a) qualify the DUT regarding some target specifications and (b) design optimum source and load matching networks for given target performance, this being output power, linearity, efficiency etc.

The load pull setup of FIG. 1 is a classical "scalar" setup: the injected (available) input power is measured by an input power meter attached to the directional coupler (see ref. 10). The power delivered by the output tuner to the load is measured using the output power meter. No reflected powers or signal phase information can be measured. The tuners are pre-calibrated and the measurement accuracy depends on their repeatability under all RF power conditions. The wave or vector load pull setup of FIG. 2 is different: Herein bi-directional couplers (input and output) are inserted between the tuners and the DUT. The method is called "wave load pull" or "vector load pull", (see ref. 6) because the couplers allow measuring the forward <a> and reverse <b> travelling power waves, <a1> and <b1> at the input and <a2> and <b2> at the output of the DUT; we therefore can measure the reflected power wave at the input of the DUT <b1> and the power reflected (returned) from the load <a2>; this allows calculating the complex input reflection factor ($\Gamma_{IN}$=<b1>/<a1>) of the DUT as well as the load reflection factor ($\Gamma_{Load}$=<a2>/<b2>), without relying on tuner calibrations and the required mechanical repeatability of passive tuners (see ref. 2). In the case of active systems (see ref. 12) the vector load-pull method is mandatory, since the virtual reflection factor created by active systems through reverse injection of coherent signal power, depends on the linearity of the feedback amplifiers, (see ref. 9) which can change with the processed signal power and, therefore, cannot be repeatably pre-calibrated.

Active tuning is the method of creating a load impedance not by reflecting signal on a real (passive) load (output) tuner, but by injecting into the DUT a signal synchronized (coherent) with the input signal. By controlling amplitude and phase of the injected signal one can control the complex load impedance and, by using amplification, one can apply more power to the DUT than the DUT injects into the load, thus creating a reflection factor <a2>/<b2> that may exceed 1. This capacity of active systems is used to compensate for insertion loss of the networks embedding the DUT (cables, adapters, test fixtures or wafer probes). In terms of equations $\Gamma_{Load}$=<a2>/<b2>, with <b2> created by the DUT and <a2> created by the injection, wherein <a2> can be smaller, equal or larger than <b2>.

Digital electronic tuners (see ref. 3, 4) use microstrip transmission lines and several PIN diodes (see ref. 5), mounted and biased along and between the transmission line and ground (see ref. 3 and FIGS. 8 and 9). Circulators and mixers are standard components, commercially available in a large variety of configurations and bandwidths (see ref. 6 and 9). The same is valid for low pass filters (see ref. 8).

Digital electronic tuners and circulators have limitations. The digital electronic tuners generate irregular point distribution over the Smith chart (FIG. 7), limited tuning range and have relatively high loss, due to the dielectrically loaded microstrip transmission lines used (FIG. 8). Multi-octave electronic tuners, although feasible, require in-depth knowledge of the design and manufacturing technology and are not commercially available. Circulators, on the other hand, are commercially available but critically band-limited (see ref. 7). Octave-frequency band circulators exist only above 1 GHz and higher than octave band circulators are rare. Frequency mixers (see ref. 6) are commercially available in narrow and large band form. They have typically one high frequency (RF) signal port, one pump (local oscillator, LO) port and a low to inter-medium (IF) frequency port. In frequency terms $F_{IF}=F_{RF}-F_{LO}$ (high sideband) or $F_{IF}=F_{LO}-F_{RF}$ (low sideband). The nonlinear characteristic of the diodes used in the mixers creates also higher frequency sideband products and must therefore, be suppressed using low pass filters (see ref. 8). The basic mixer response comes from the product of two sinus signals generated by the nonlinearity of the diodes in the mixer: $\sin \omega_1 t * \sin \omega_2 t = \frac{1}{2} * \{\cos(\omega_1-\omega_2)t - \cos(\omega_1+\omega_2)t\}$, wherein $\omega = 2\pi * F$; for $\omega 1 = 2\pi F_{IF}$ and $\omega 2 = 2\pi F_{LO}$ means there is a primary RF frequency component $2\pi*(F_{LO}-F_{IF})$ that has to be processed by the digital tuning module (FIGS. 3 and 4) and a secondary RF frequency component $2\pi*(F_{LO}+F_{IF})$ that has to be suppressed using the low pass filter.

BRIEF SUMMARY OF THE INVENTION

The proposed load pull tuner uses the heterodyne (see ref. 11) concept (FIGS. 3 and 4) and allows for making a real low frequency wideband active load pull tuner: Both, octave-band or less wideband circulator (see ref. 7) and electronic tuner technology limitations at low (MHz range) frequencies are bypassed with a single stroke, using the heterodyne concept: the low operation frequency is mixed up into the commonly used circulator/electronic tuner wider frequency range around 1 to 4 GHz, to create and control the load pull impedances, and converted down again to low IF frequencies to be amplified by inexpensive power amplifiers and injected back into the DUT to create the virtual "active" load; both the circulator and the associated electronic tuner are not required to cover the low operation frequency and the usual frequency bandwidth of circulators and electronic tuners at RF frequencies are sufficient to cover multi-octave low frequency band operation.

DETAILED DESCRIPTION OF THE DRAWINGS

The invention and its mode of operation will be better understood from the following detailed description when read with the appended drawings in which:

FIG. 6A through 6B depict the conversion modules/mixers; FIG. 6A depicts the up-conversion module using mixer 1 and FIG. 6B depicts the down-conversion module using mixer 2.

FIG. 7 depicts prior art, the complete tuning pattern of a digital electronic tuner at its internal test port reference plane, using 10 RF switches (PIN diodes), when the idle port is terminated with characteristic impedance $Z_O$ (typically 50Ω).

DETAILED DESCRIPTION OF THE INVENTION

Figure 3:
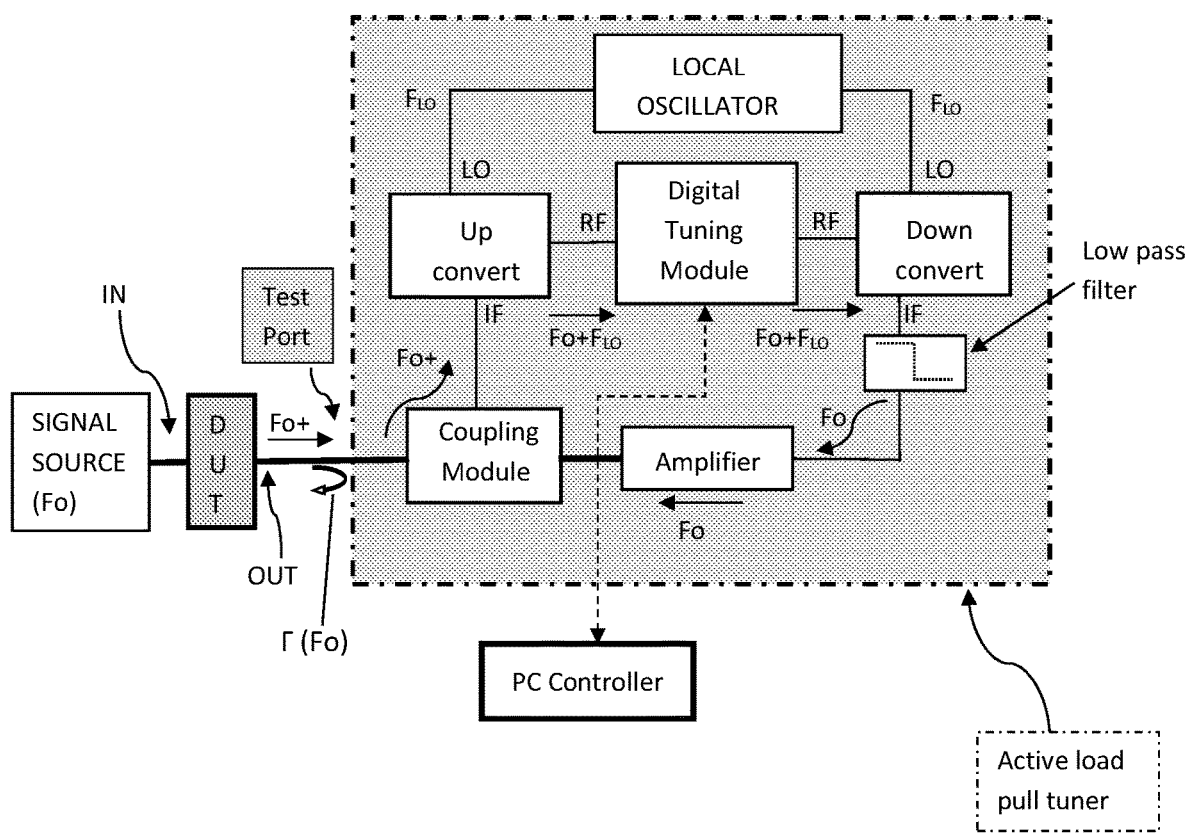
FIG. 3 depicts a first embodiment of the heterodyne low frequency active load pull tuner.
Figure 5:
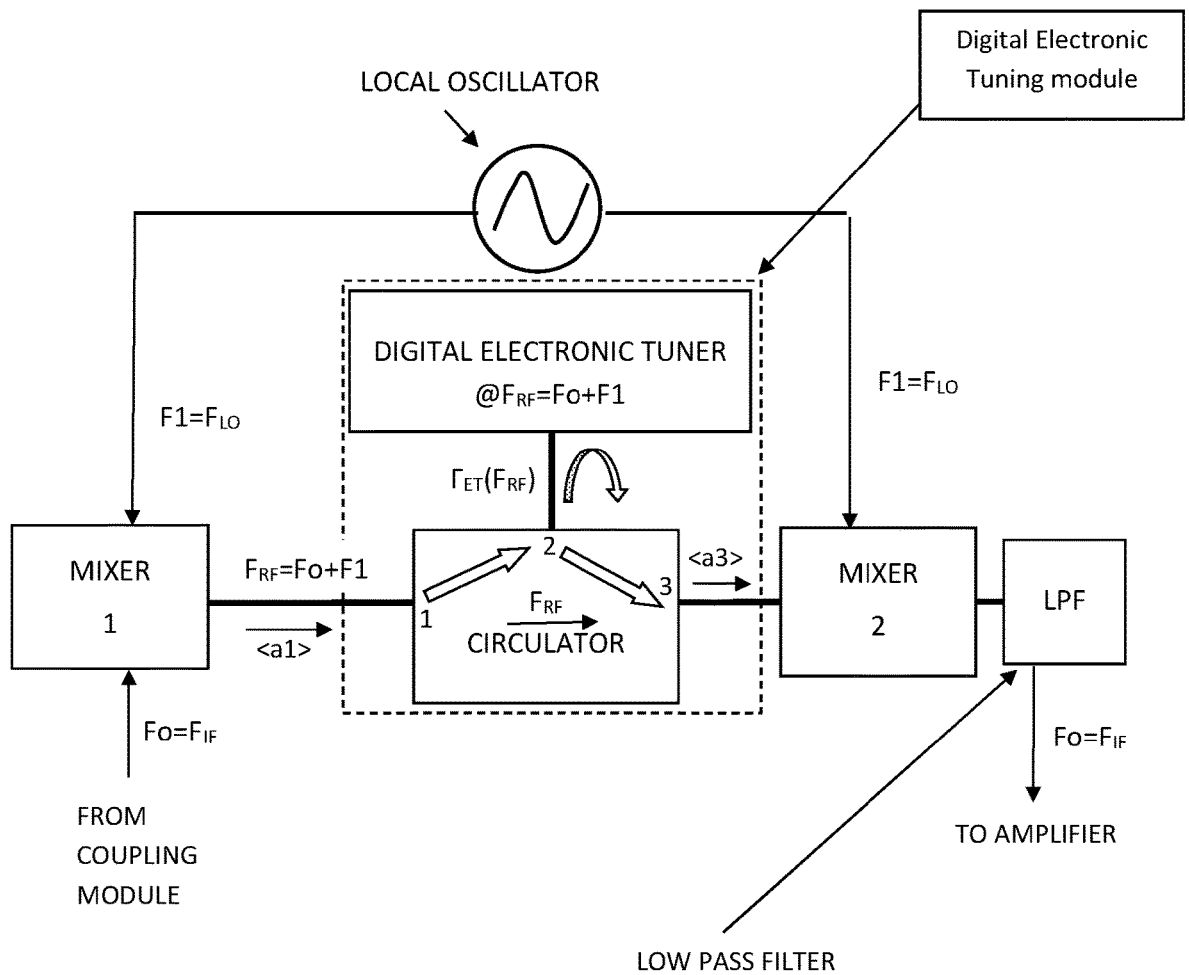
FIG. 5 depicts the concept of up- and down-conversion modules used in connection with the digital electronic tuning module.
Figure 8:
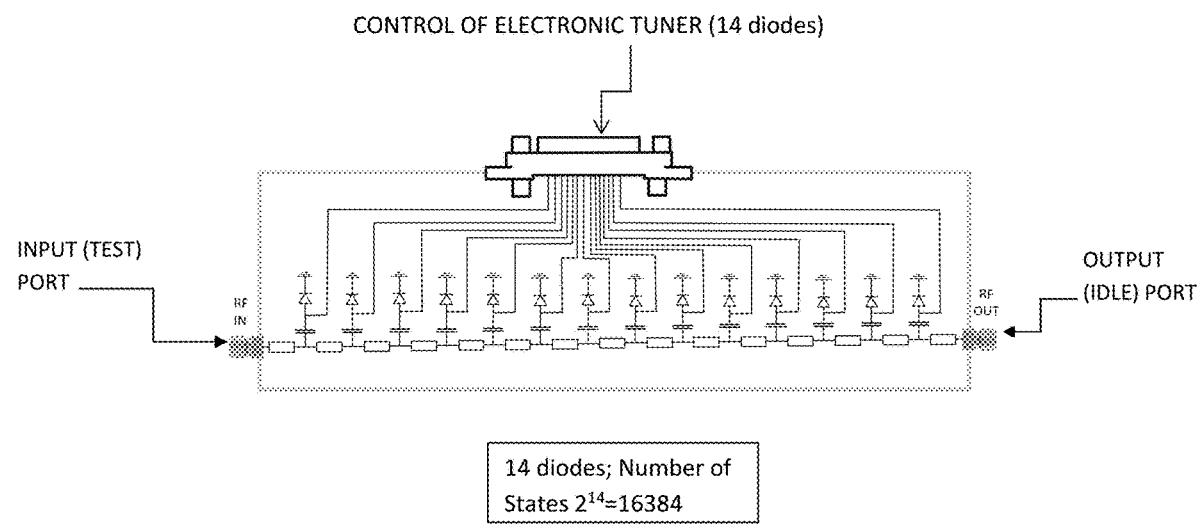
FIG. 8 depicts a 14 PIN diode electronic tuner prototype.
Figure 9:
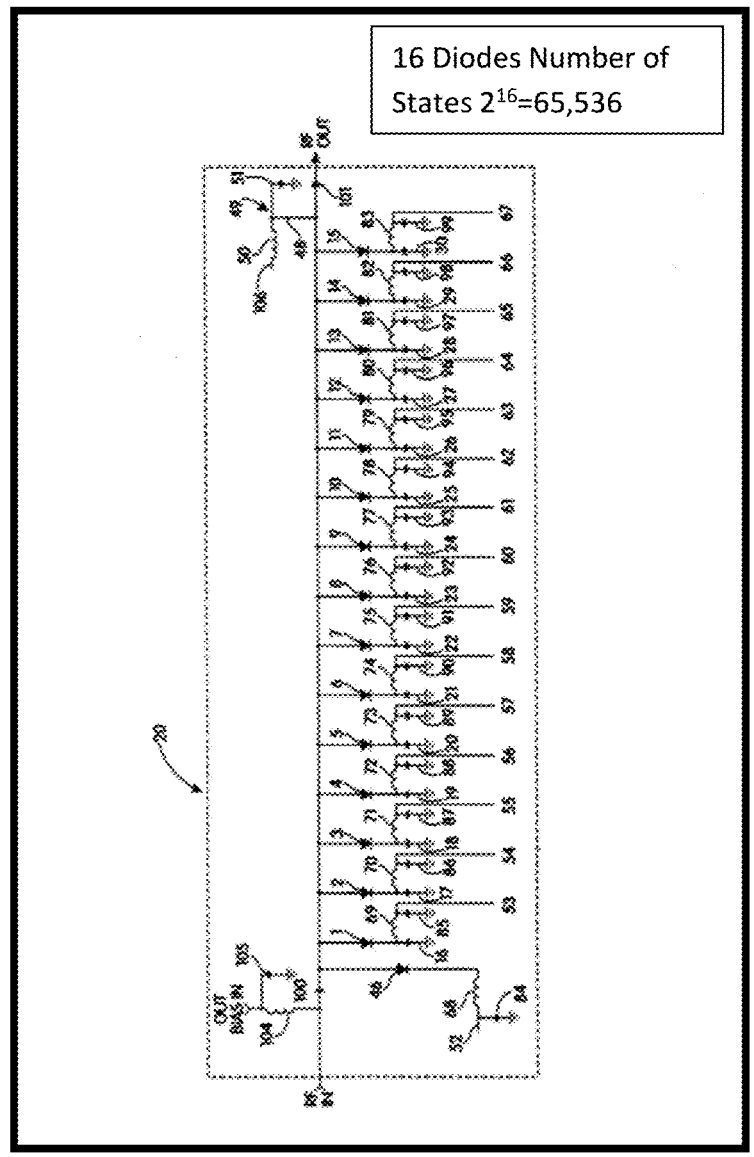
FIG. 9 depicts prior art, the electrical diagram of an electronic PIN diode tuner

A first embodiment of the low frequency active tuner is shown in FIG. 3: The output port of the DUT is connected to the test port of the active tuner. The input signal at low frequency $F_O$ (MHz range) generated by the signal source is injected into the input port of the DUT, amplified by the DUT and extracted from the DUT output port. The amplified $F_O$ signal enters the tuner at the input port of the coupling module; a portion of the $F_O$ signal is coupled out and injected into the IF port of the up-conversion module (Mixer 1). There it is mixed up with the pump LO signal of the high frequency local oscillator (GHz range) and generates an RF (GHz range) output signal. This RF signal ($F_{LO}+F_O$) is injected into the first port (1) of the circulator (FIG. 5); in a circulator the signal is transferred quasi without insertion loss from port 1 to port 2, from port 2 to port 3 and back from port 3 to port 1. There is no transmission from port 2 to port 1 or from port 3 to port 2; the signal is then transferred, with minimal loss, to port 2 of the circulator where it is injected and reflected back at the test port of the digital electronic tuner, whose idle port is terminated with characteristic impedance $Z_O$. For instance, a one octave wide 1-2 GHz circulator and a 1-2 GHz electronic tuner, combined with a 990 MHz local oscillator will cover 10-1010 MHz IF operation bandwidth, or 6.7 octaves ($1010/10=101\approx2^{6.7}$). This has never been expected to be feasible up to now; of course, the practical setup will also be associated with the availability of adjustable or exchangeable low-pass or band-pass filters in the up- and down-conversion paths.

Figure 10:
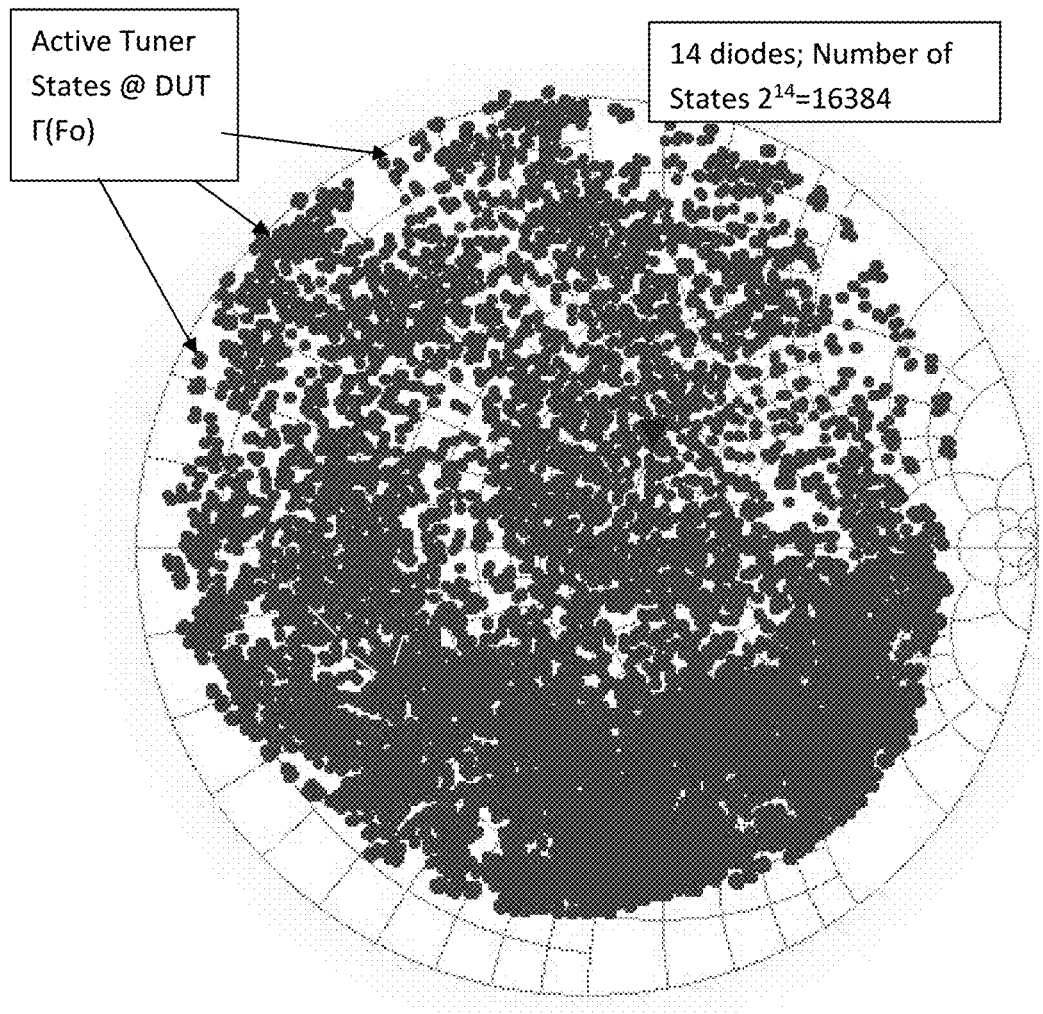
FIG. 10 depicts the complete tuning pattern of a digital electronic tuner prototype at its internal test port reference plane, using 14 RF switches (PIN diodes).

The reflection factor $\Gamma_{ET}(F_{RF})$ at the test port of the digital electronic tuner is spread over the Smith chard as shown in FIGS. 7 and 10. The transfer properties of the circulator create a signal at port 3 as follows: $<a3>=<a1(F_{RF})>*S21(F_{RF})*\Gamma_{ET}(F_{RF})*S32(F_{RF})\approx<a1(F_{RF})>*\Gamma_{ET}(F_{RF})$, because $|S21|\approx|S32|\approx1$; this corresponds to a forward signal transmission factor $<a3>/a1>\approx\Gamma_{ET}(F_{RF})$, meaning that the digital tuning module controls, with a fixed phase-offset because of the fixed phases of S21 and S32, fully the amplitude and phase of the feedback loop. The outgoing signal wave $<a3>$ from port 3 is then injected into the RF port of mixer 2 and is down-converted into the low frequency $F_{IF}=F_O=F_{RF}-F_{LO}$, which passes through the low pass or band-pass filter, which accompany all mixer operations to suppress the upper sideband and harmonic components, and is injected into the amplifier. The amplified signal is then injected into the output port of the DUT after traversing the coupling module from its output to its input port (the couplers, having port 1 as input port, port 2 as output port and port 3 as coupling port, are reciprocal, meaning S21=S12).

Figure 4:
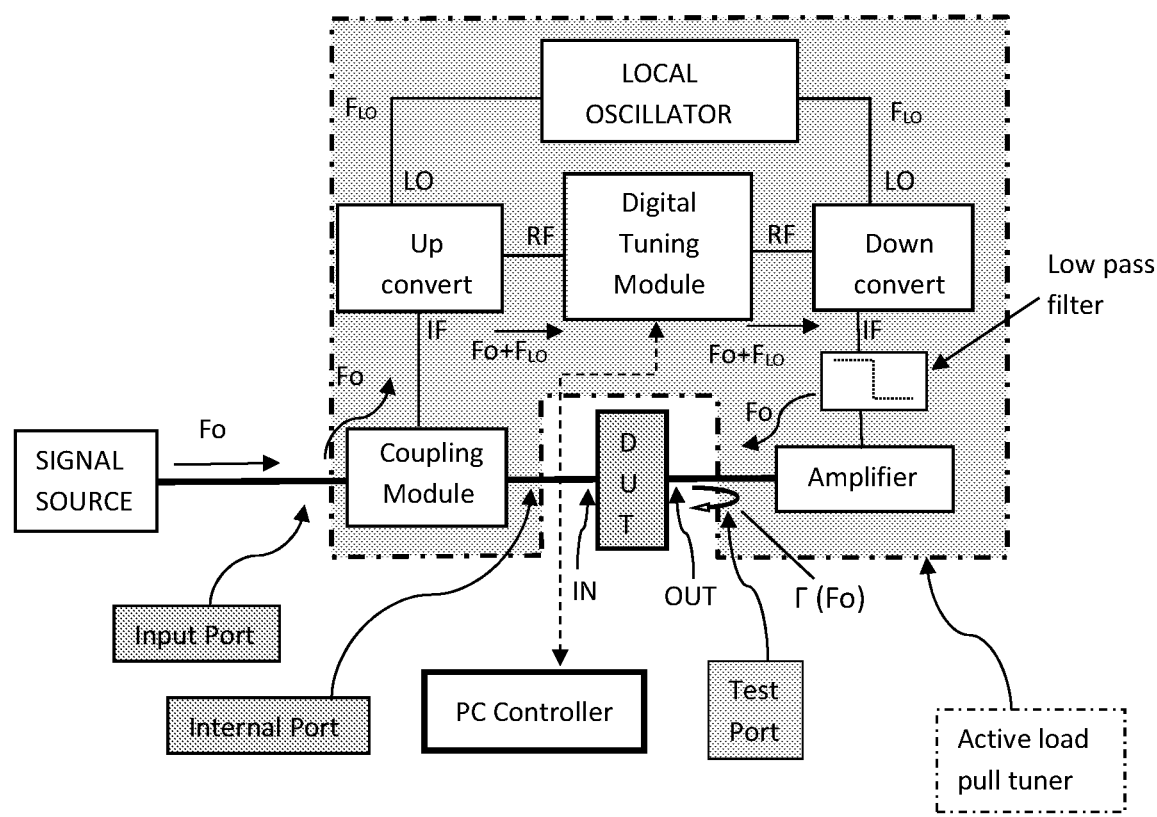
FIG. 4 depicts a second embodiment of the heterodyne low frequency active load pull tuner.

The previously discussed embodiment of FIG. 3 is best suitable for medium to low power operation or for testing highly linear DUT creating low harmonic content. The reason is that in the embodiment of FIG. 3 the signal coupled into the up-conversion module stems from the DUT output and contains any harmonic components created by the DUT; this risks creating a multitude of spurious signals that will require further filtering. Instead the embodiment of FIG. 4 shows a slightly different configuration, which, instead of a single test port as FIG. 3, comprises an input port, an internal port and a test port. The tuner of FIG. 4 samples the pure single tone signal of the signal source before it is processed by the DUT and is couples it into the up-conversion module (FIG. 6A); the signal is then processed in the digital tuning module (FIG. 5), down-converted (FIG. 6B), filtered and amplified before being injected back into the DUT. Additionally, since the returning signal from the amplifier does not traverse the coupling module on its way from the amplifier to the DUT output port, it also suffers less loss. The whole operation in this second embodiment (FIG. 4) occurs at lower power level with less content of spurious, but a higher requirement for amplifier gain, because the sampled signal by the coupling module comes un-amplified by the DUT. On the other hand, the lower loss on the path between amplifier and DUT allows using lower power amplifiers. This is significant, considering that, in power amplifier technology, the critical parameter is output power and not gain. A high gain-low power amplifier is easier to make and cheaper than a low gain-high power amplifier.

The digital electronic tuner used in the tuning module (FIG. 5) has the major advantage of allowing high tuning speed in the range of milli-seconds, compared with several seconds required by mechanical tuners. The use of the heterodyne concept also allows using a single, inexpensive, local oscillator, instead of an external variable frequency signal generator.

Figure 11:
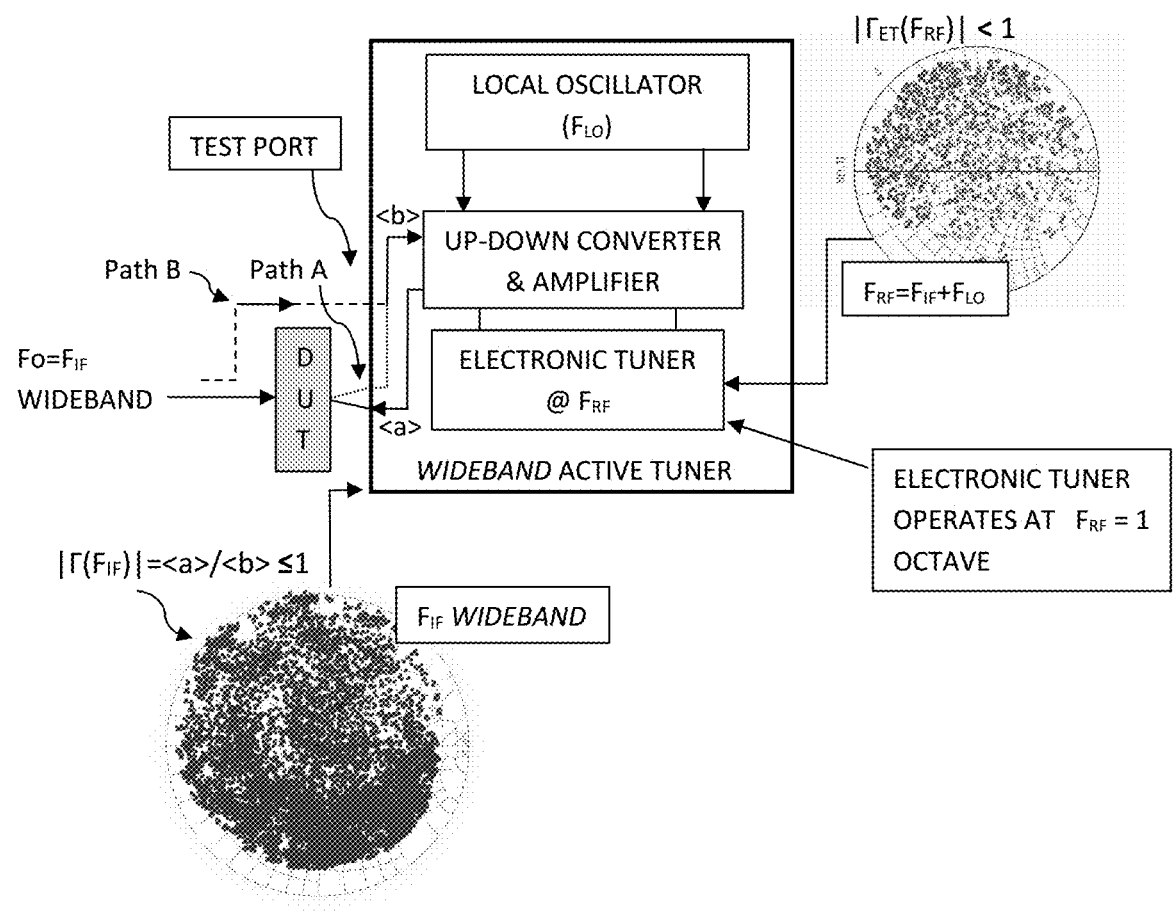
FIG. 11 depicts the conceptual overall tuning operation of the low frequency active tuner.

FIG. 11 summarizes, in a more representative form, the two tuning embodiments: A signal power wave <b> entering the tuner either via path A ----------- (from the output of the DUT) or via path B - - - - - (direct from the signal source, before passing through the DUT) is up-converted, amplitude- and phase-modulated, down converted, filtered and amplified to be injected back into the DUT. The reflection factor cloud TET of the remotely controlled digital tuner is converted by the digital tuning module into an amplitude- and-phase modulated signal power wave <a> which is injected back into the DUT, creating the desired virtual load $\Gamma_{Load}$=<a>/<b> at the original low frequency $F_{IF}$. Because of the amplification, <a> can be equal or even exceed <b>, meaning the virtual reflection factor can exceed 1. Overall, if the conversion loss of the conversion modules is L1 and L2, both <1 (typically linear 0.3 or logarithmic 10 dB) the coupling factor of the coupling module is C (<1) and the gain of the amplifier is G, then, assuming the transfer coefficients S21 and S32 of the circulator to be approximately 1 (ignoring the phase information, because of the omni-spread digital tuner states at its test port, with the idle port terminated with $Z_O$, shown in FIGS. 7 and 10), we can estimate that the virtual reflection factor at the test port is $\Gamma_{Load}$=<a>/<b>≈C*$\Gamma_{ET}$*L1*L2*G and fully amplitude and phase controllable from 0 to >1, because of $\Gamma_{ET}$ as shown in FIG. 7.

Figure 1:
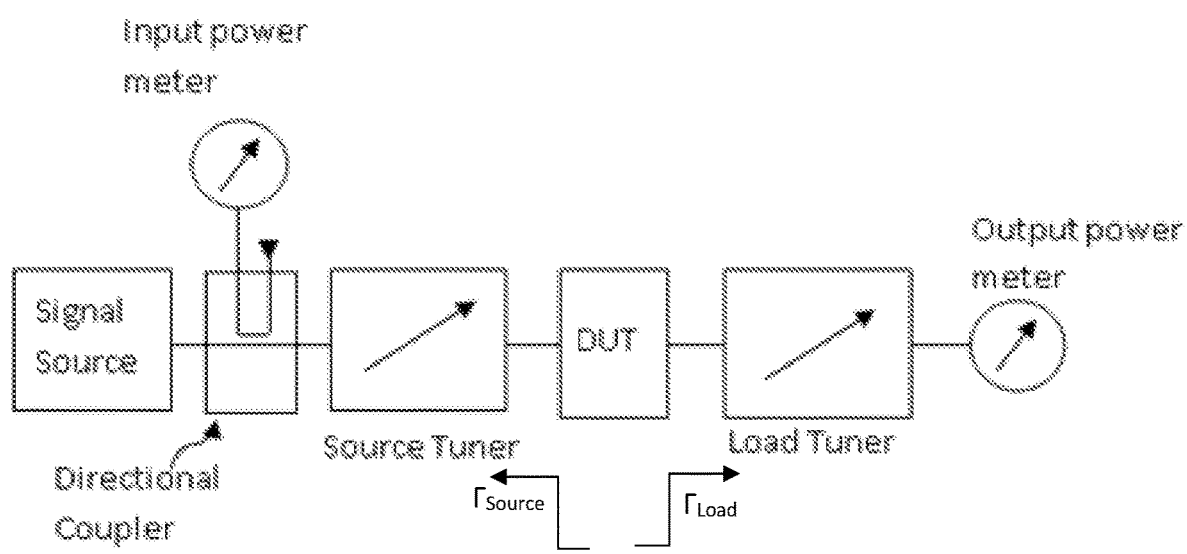
FIG. 1 depicts prior art, a typical scalar load pull test system using pre-calibrated passive tuners.
Figure 2:
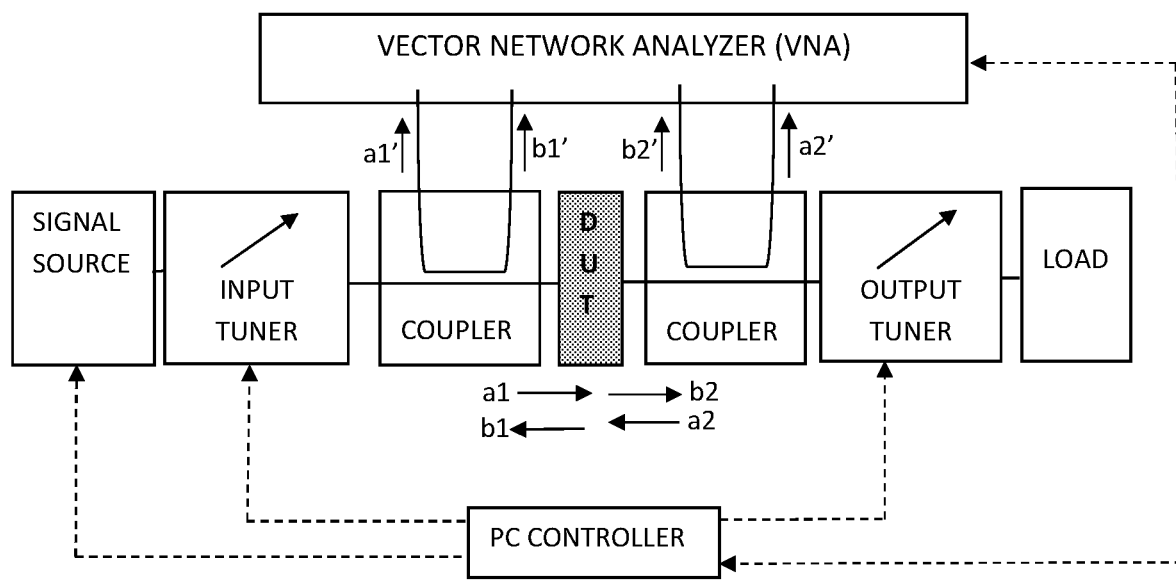
FIG. 2 depicts prior art, a wave- or vector-load pull test system with in-situ travelling signal power wave measurement capability.

Active tuners cannot be used in an open-loop environment: i.e. they cannot be calibrated ahead of time for the calibration data to be used in actual measurements. The simple reason is that active tuners comprise amplifiers, and amplifiers become notoriously non-linear in amplitude and phase when compressed, i.e. when the input power exceeds a certain level. In theory this can be avoided by using highly over-dimensioned amplifiers, but those tend to be overly expensive, meaning unaffordable. In addition, the nonlinear effects, i.e. the drift in performance, occur unexpectedly and without warning during the measurement operation adding this way a prohibitive level of uncertainty factor in the measurement quality. The only realistic alternative is to use a vector test setup as shown in FIG. 2. This test setup uses two bidirectional couplers, immediately connected to the DUT at the input and output port, and sample forward and reverse signal waves <ai> and <bi> and inject them into the test ports of a network analyzer. Using appropriate calibration techniques the <ai'> and <bi'> are referred back to the DUT internal ports and allow calculating the in-situ, real-time load reflection factor $\Gamma_{Load}$=<a2>/<b2> created by the active tuner at all harmonic frequencies including any non-linearities. This operation allows also fast iterations to select the proper electronic tuner state for any required impedance out of the cloud shown in FIG. 11.

This application discloses the concept of a heterodyne, broadband, high-speed low frequency active load pull tuner. Obvious alternatives shall not impede on the originality of the concept.

What is claimed is:

1. A low frequency active load pull tuner having a test port, comprising
    a) a coupling module having input, output and coupled port,
    b) an up- and a down-conversion module, each having LO, RF and IF ports,
    c) a local oscillator,
    d) a digital electronic tuning module having input and output port,
    e) a low pass filter having input and output port, and
    f) an amplifier having input and output port;
    wherein
    the test port of the active load pull tuner is connected to an output port of a DUT,
    the input port of the coupling module is connected to the test port of the tuner,
    the coupled port of the coupling module is connected to the IF port of the up-conversion module,
    the output port of the coupling module is connected to the output port of the amplifier,
    the RF port of the up-conversion module is connected to the input port of the digital tuning module,
    the output port of the digital tuning module is connected to the RF port of the down-conversion module,
    the local oscillator is connected to the LO ports of the up- and the down-conversion modules,
    the IF port of the down-conversion module is connected to the input port of the low pass filter,
    the output port of the low pass filter is connected to the input port of the amplifier.

2. A low frequency active load pull tuner having an input port, an internal port and a test port, comprising
    a) a coupling module having input, output and coupled port,
    b) an up- and a down-conversion module, each having LO, RF and IF ports,
    c) a local oscillator,
    d) a digital electronic tuning module having input and output port,
    e) a low pass filter having input and output port, and
    f) an amplifier having input and output port;
    wherein
    the input port of the active load pull tuner is connected to the input port of the coupling module,
    a signal source is connected to the input port of the active load pull tuner,
    the coupled port of the coupling module is connected to the IF port of the up-conversion module,
    the output port of the coupling module is connected to the internal port of the active load pull tuner, the internal port of the active load pull tuner is connected to an input port of a DUT, the local oscillator is connected to the LO ports of the up- and the down-conversion modules, the RF port of the up-conversion module is connected to the input port of the digital tuning module, the output port of the digital tuning module is connected to the RF port of the down-conversion module, the IF port of the down-conversion module is connected to the input port of the low pass filter, the output port of the low pass filter is connected to the input port of the amplifier, the output port of the amplifier is connected to an output port of the DUT.

3. The low frequency active load pull tuner of claim 1 or 2 wherein the coupling module comprises a directional coupler having input, output and coupling port, and wherein the input, output and coupling port of the directional coupler are connected to the associated input, output and coupling port of the coupling module.

4. The low frequency active load pull tuner of claim 1 or 2, wherein the up-conversion module comprises signal mixer 1, the down-conversion module comprises signal mixer 2, each said signal mixer having RF port, IF port and LO port connected to the associated RF, IF and LO ports of the corresponding conversion module.

5. The low frequency active load pull tuner of claim 1 or 2, wherein the digital tuning module comprises a remotely controlled digital electronic tuner having a test port and an idle port, a circulator having ports 1, 2 and 3, and wherein port 1 of the circulator is connected to the input port of the digital tuning module, port 2 of the circulator is connected to the test port of the digital electronic tuner, and port 3 of the circulator is connected to the output port of the digital tuning module, and wherein signal flow in the circulator is from port 1 to port 2, from port 2 to port 3 and from port 3 to port 1, the idle port of the digital electronic tuner is terminated with characteristic impedance.

\* \* \* \* \*